(12) United States Patent
Kasprzak et al.

(10) Patent No.: US 8,654,145 B2
(45) Date of Patent: Feb. 18, 2014

(54) BINDING USING ROLLBACK

(75) Inventors: Kristopher C. Kasprzak, Huntsville, AL (US); Daniel Staples, Madison, AL (US); Vadiraj Mysore, Madison, AL (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 2671 days.

(21) Appl. No.: 11/143,883

(22) Filed: Jun. 1, 2005

(65) Prior Publication Data

US 2006/0284869 A1 Dec. 21, 2006

(51) Int. Cl.
 *G09G 5/00* (2006.01)
(52) U.S. Cl.
 USPC .......................................... 345/619; 700/103
(58) Field of Classification Search
 USPC .................................. 700/103; 345/428, 419
 See application file for complete search history.

(56) References Cited

U.S. PATENT DOCUMENTS

| 6,654,011 | B1 | 11/2003 | Dreyfus |
| 6,782,517 | B2 * | 8/2004 | Rittman et al. .................. 716/4 |
| 2003/0160779 | A1 | 8/2003 | Rabinovich et al. |

FOREIGN PATENT DOCUMENTS

| EP | 0 768 624 | A2 | 4/1997 |
| EP | 768624 | A2 * | 4/1997 |

OTHER PUBLICATIONS

Hoppe, "Progressive Meshes", 1996, ACM, pp. 99-108.*
Microsoft Word 2003, Microsoft Corporation, 1983-2003.*
Xiangping C, et al: "On editability of feature-based design"; Computer Aided Design, Elsevier Publishers BV, Barking, GB; vol. 27, No. 12, Dec. 1995; pp. 905-914; XP004.
David Marcheix, Guy Pierra: "A Survey of the Persistent Naming Problem" International Conference on Solid Modeling, [Online]; Jun. 17, 2002; pp. 1-10; XP002406396.
Bidarra R et al: "Persistent Naming through Persistent Entities", Geometric Modeling and Processing, 2002. Proceedings Jul. 10-12, 2002, Piscataway, NJ, USA, IEEE, Jul. 1, 2002.

* cited by examiner

*Primary Examiner* — Michelle L Sams

(57) ABSTRACT

Most three dimensional geometric modeling programs employ a feature-based parametric modeling technique. A modification attempted by a user in a feature-based parametric modeling may provide a result different than that expected by the user, since most edits require a "roll back" of a history tree to the state wherein the geometry was originally created. Upon completing the edit, the tree rolls forward, taking into account the changes you have made. A problem arises when a parent feature is destroyed and now a child feature can no longer properly bind. The disclosed invention solves this problem by rolling back the tree to find the last successful bind made by the child, and then roll the model forward such that all downstream binding occurs with the successful bind in tact.

18 Claims, 13 Drawing Sheets

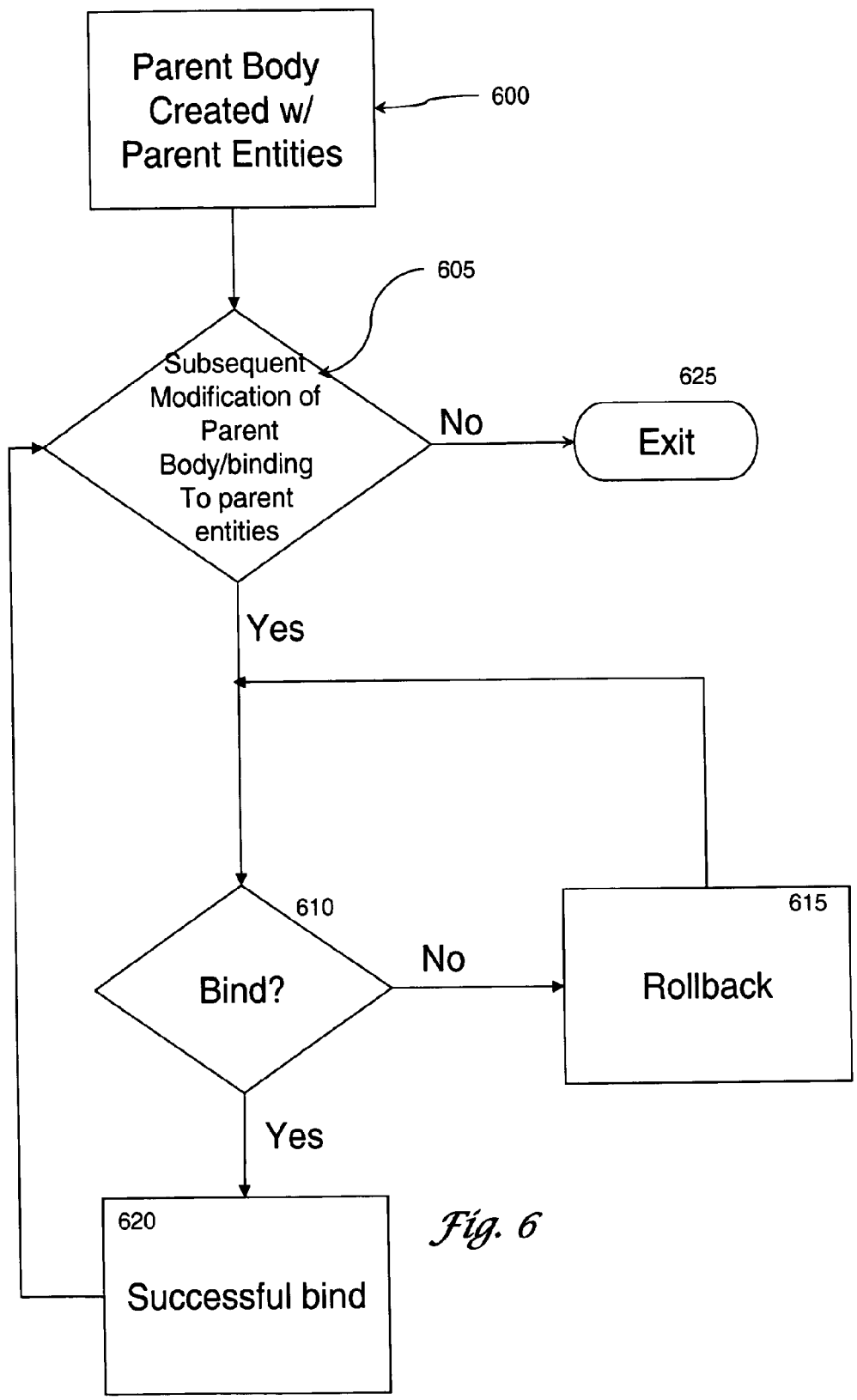

BINDING USING ROLLBACK

TECHNICAL FIELD

This invention relates generally to computer graphics. More specifically, the invention relates to the system and method of binding objects in a three-dimensional system.

BACKGROUND

The computer has greatly affected essentially all forms of information management, including the graphical editing and computer aided design and drafting (CAD) tools. Some simpler geometric modeling computer program products are two dimensional, providing only length and width dimensions of objects, while more complex and powerful computer program products provide three dimensional editing and visualization.

Three dimensional geometric modeling programs can generate a scene or part which can comprise one or more constituent 3D solid shapes. For example, a scene featuring a simple table could comprise a solid shape for each leg of the table, as well as a solid shape for a flat table top. The geometric modeling computer program typically has an executable object used to define and generate each solid shape. The object for each solid shape can have several components, the components being a combination of executable code and data structure. For example, a boundary representation ("B-rep") component includes a data structure describing the geometry and entity data for the solid shape (e.g., length, width, depth, and coordinates of the solid part).

Most three dimensional geometric modeling programs employ a feature-based parametric modeling technique. In feature-based parametric modeling, the executable object for each solid shape has not only a boundary representation component, but also a history or creation component, referred to herein as a "feature tree" or "dependency tree," which includes a data structure reflecting how a solid shape has been created. That is, the dependency tree includes data that indicates an order or chronological sequence of steps employed to construct the solid shape. For a simple solid block, for example, the history may indicate that the solid block began as a simple two dimensional rectangle that was extruded into a third dimension.

Typically, when the user wants to modify a feature-based solid shape by changing any aspect of the solid shape, the feature-based parametric modeling technique re-evaluates the entire solid shape, i.e., goes through the entire dependency tree in order to revise the part in accordance with the change. For example, if the user wanted to lengthen the table top of the table described above, another solid shape would be added adjacent to the previous table top. In so adding another solid shape corresponding to the increased length of the table top, another step is added to the history. Alternatively, the user may modify the 2D profile of the table top and let the program re-evaluate the solid shape of the table.

Often, a modification attempted by a user in a feature-based parametric modeling may provide a result different than that expected by the user, since most edits require a "roll back" of the tree to the state wherein the geometry was originally created. As the edit is performed, it may destroy an entity that a feature added downstream uses to bind for position in the model, causing a binding failure. As a result, the downstream feature must be manually reedited and repositioned to maintain design intent destroyed by a subsequent modification added later in time, but earlier in the feature tree.

Generic Example of Binding Failure

Referring to FIG. 1. The user creates a cube 100 that is 4 inches×4 inches×4 inches—corresponding to length×width×height. The user then defines a hole feature 105 through the middle of the cube 100, positioning a hole center 110 a distance of 2.000 inches from a mid-point of a straight reference edge 115 of a cube face 120. Then the user inserts a dimension notation 125 from the hole center 110 to the straight reference edge 115 of the cube 100, thereby binding not only the hole 105 to the straight reference edge 115, but also the dimension notation 125 to the straight reference edge 115. At this point the straight reference edge 115 is a parent to at least two children, the hole 105 and the dimension notation 125. A binding problem arises when a subsequent feature modifies the parent in such a way that the parent gets destroyed causing the at least one child to fail to bind to the parent.

Referring now to FIG. 2 to illustrate this binding problem, the user subsequently modifies the cube 100 from the original straight reference edge 115 to a round feature 200 inserted before the hole 105 by rolling back feature tree for the solid model to insert the round 200 between the cube 100 and hole 105, thereby causing the feature to change from cube→hole to cube→round→hole. As the model computes, it creates the cube 100; the round 200; and then tries to bind the hole 105 to the straight reference edge 115, as before. This action results in a bind failure because the straight reference edge 115 used to position the hole 105 is no longer present.

Conclusion

There is a need for a solution that can maintain the binding of child object where its parent object is modified or otherwise destroyed by a subsequent modification and that is independent of parent, where that parent geometry can be analytical or spline-based. Analytic geometry refers to referencing geometry that follows a mathematical function like spheres, cones, tori, etc. Whereas, spline-based geometry refers to referencing geometry that does not conform to known mathematical equations and is approximated, like free form, for example.

SUMMARY

In accordance with the purpose of the invention as broadly described herein, the present invention provides a method of binding a plurality of features in a solid model, comprising the steps of: modifying a solid model by inserting a modifying object feature into said solid model between a prior object feature of said solid model and a following object feature of said solid model, wherein said modifying object feature has an entity that modifies the prior object feature and wherein said object features contain a plurality of feature proxies; re-computing said solid model, comprising the steps of: verifying a proxy bind operation for said object features; and if said verifying step is not successful: rolling back said solid model to a prior feature state; binding the modified object feature to the feature proxy for the prior object feature; and repeating said re-computing step; and rolling the modified solid model forward to display said object features. Each said object feature can be one of a hole, a draft, a block, or a round. The feature proxies are comprised of a face, an edge or a vertex. The re-computing step is for display of said solid model.

And the present invention provides a method of successfully displaying a three-dimensional solid model with at least three object features wherein one object feature is a prior object feature, one object feature is a modifying object feature, and one object feature is a following object feature, comprising the steps of: inserting a modifying object feature between a prior object feature and a following object feature of a solid model wherein said prior object feature has a plurality of parent proxies and said following object feature binds to said plurality of parent proxies, such that the insertion of said modifying object feature alters an entity of said solid model; rolling said solid model forward to display all object features wherein if said following object feature fails to bind to at least one of said parent proxies, said solid-model is rolled back to said prior object feature until said following object feature successfully binds to said parent proxy; and following the successful bind of said following object feature to said parent proxy, rolling forward said solid model to display all object features without a bind failure. Each said object feature can be one of a hole, a draft, a block, or a round. The parent proxies are comprised of a face, an edge or a vertex.

The present invention also provides a method of designing a solid model, comprising the step of: binding a child entity having a parent entity to an ancestor entity if said parent entity has been destroyed, wherein said parent entity and said ancestor entity may be one of spline and analytic.

An advantage of the present invention is that it can preserve downstream binding of child object entity after the parent object entity is destroyed by a subsequent modification.

Another advantage of the present invention is that the binding can be independent of the type of entity, where the type of entity can be analytic or spline-based.

Other advantages of the present invention will be set forth in part in the description and in the drawings that follow, and, in part will be learned by practice of the invention.

Except as may be explicitly indicated otherwise, the following definitions apply: bind, v., refers to an associative parent-child relationship between one element and another, wherein if Element B is bound to Element A and Element A moves, then Element B moves also; bound, v., past tense of bind; entity, n., faces, edges, and vertices of a 3D object; and moniker, n., assigned by the application and is a unique path for the entities;

The present invention will now be described with reference made to the following Figures that form a part hereof, and which is shown, by way of illustration, an embodiment of the present invention. It is understood that other embodiments may be utilized and changes may be made without departing from the scope of the present invention.

BRIEF DESCRIPTION OF THE DRAWINGS

A preferred exemplary embodiment of the present invention will hereinafter be described in conjunction with the appended drawings, wherein like designations denote like entities, and:

FIG. 6 is an illustration of a flowchart for the abstracted top-level of data flow for the invention;

DESCRIPTION OF THE PREFERRED EMBODIMENTS

Figure 1:
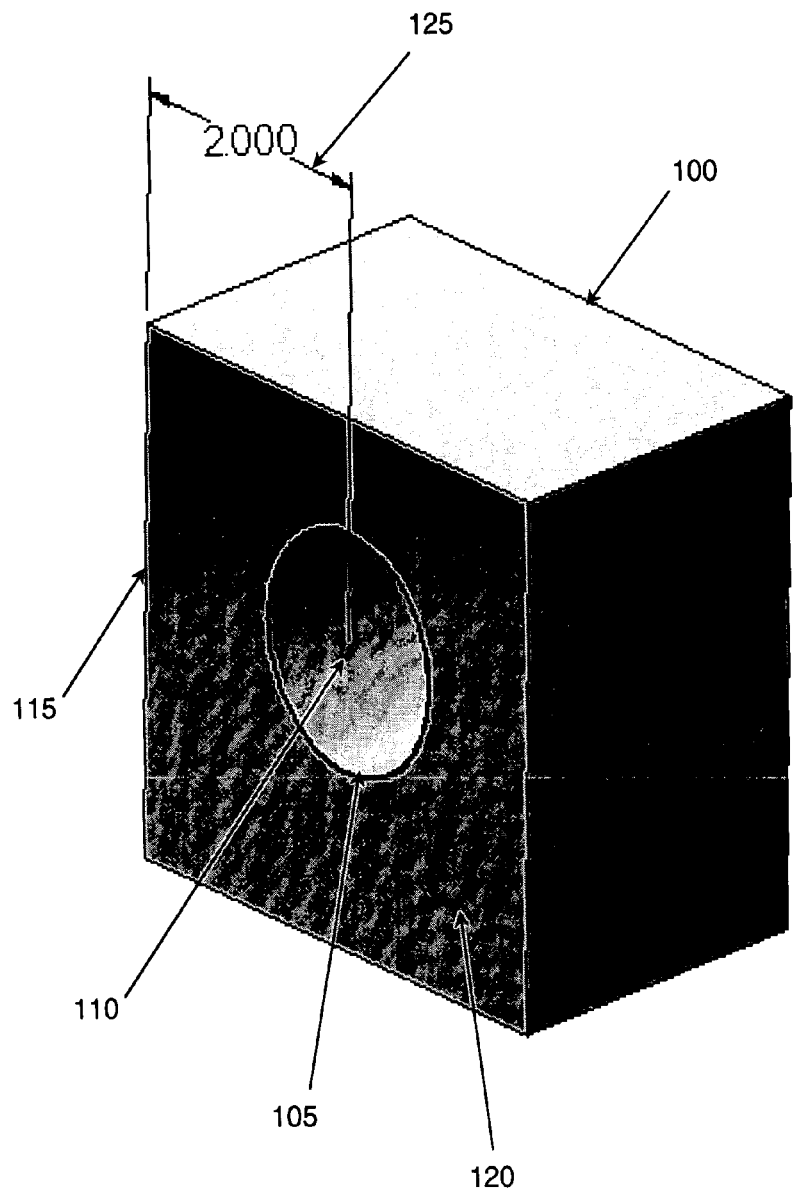
FIG. 1 (prior art) is an illustration of a solid model with a dimension feature and a hole feature.
Figure 2:
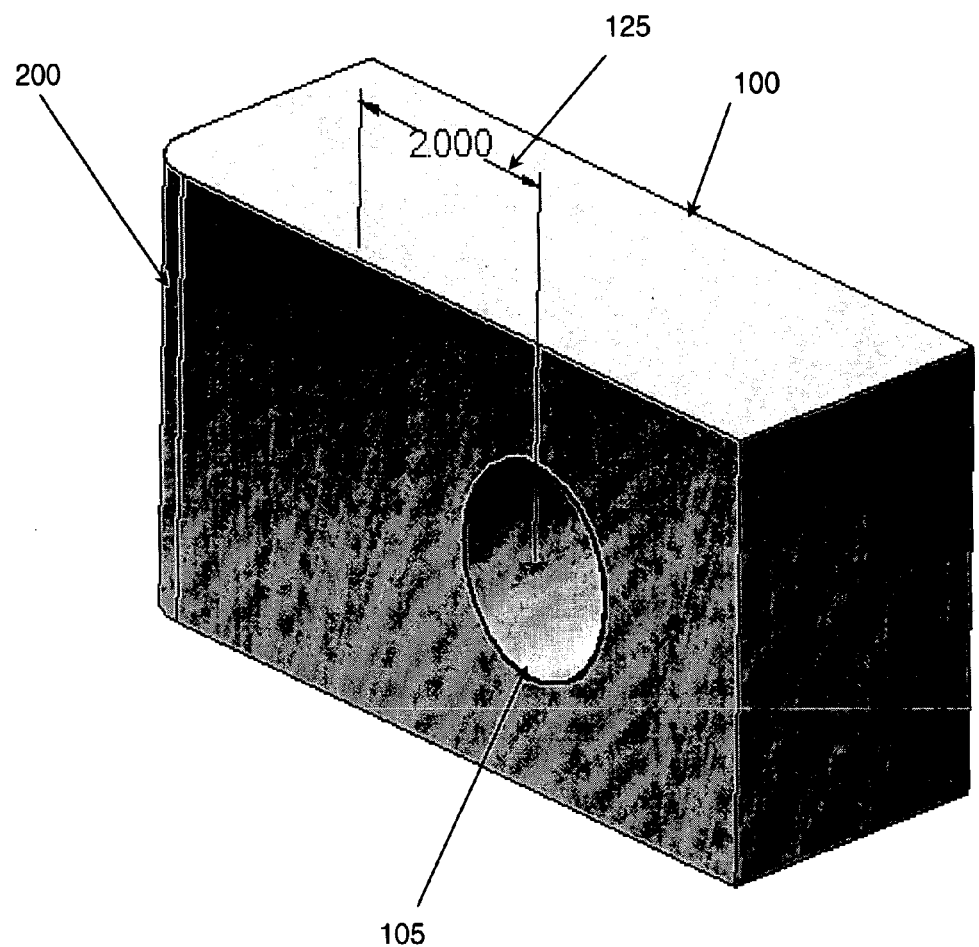
FIG. 2 (prior art) is an illustration of a solid model with a dimension feature, a round feature, and a hole feature.
Figure 3:
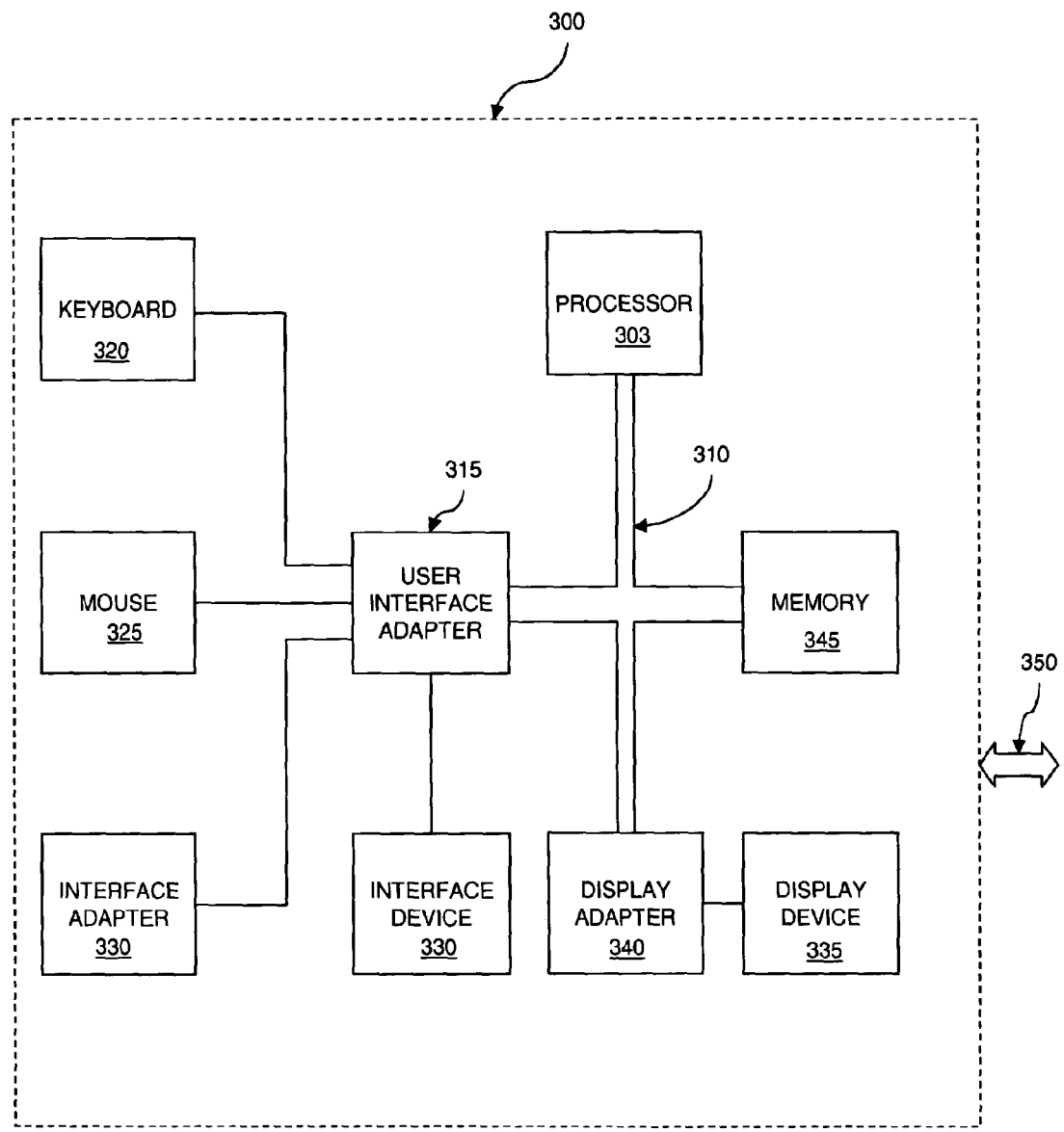
FIG. 3 is a block diagram of a computer environment in which the present invention may be practiced.

The present invention may be performed in any of a variety of known computing environments. The environment of FIG. 3 comprises a representative conventional computer 300, such as a desktop or laptop computer, including a plurality of related peripheral devices (not depicted). The computer 300 includes a microprocessor 305 and a bus 310 employed to connect and enable communication between the microprocessor 305 and a plurality of components of the computer 300 in accordance with known techniques. The computer 300 typically includes a user interface adapter 315, which connects the microprocessor 305 via the bus 310 to one or more interface devices, such as a keyboard 320, a mouse 325, and/or other interface devices 330, which can be any user interface device, such as a touch sensitive screen, digitized pen entry pad, etc. The bus 310 also connects a display device 335, such as an LCD screen or monitor, to the microprocessor 305 via a display adapter 340. The bus 310 also connects the microprocessor 305 to a memory 345, which can include ROM, RAM, etc.

The computer 300 communicates via a communications channel 350 with other computers or networks of computers. The computer 300 may be associated with such other computers in a local area network (LAN) or a wide area network (WAN), or it can be a client in a client/server arrangement with another computer, etc. All of these configurations, as well as the appropriate communications hardware and software, are known in the art.

Software programming code that can embody the present invention is typically stored in the memory 345 of the computer 300. In the client/server arrangement, such software programming code may be stored with memory associated with a server. The software programming code may also be embodied on any of a variety of non-volatile data storage device, such as a hard-drive, a diskette or a CD-ROM. The code may be distributed on such media, or may be distributed to users from the memory of one computer system over a network of some type to other computer systems for use by users of such other systems. The techniques and methods for embodying software program code on physical media and/or distributing software code via networks are well known and will not be further discussed herein.

The preferred embodiment of the present will now be described with reference to the Figures, wherein like numerals indicate like or corresponding parts throughout the several views. The present invention is practiced using a solid modeling CAD application, such as SolidEdge®, wherein a user utilizes a plurality of modeling tools available with the solid modeling CAD application to create a three-dimensional (3D) solid model. As the user creates a plurality of features for the solid model, and a plurality of binding failures occur, the disclosed invention calls a RollToBind operation to correct the binding failures.

Discussion of Solid Modeling

The user begins the solid model construction by creating at least one feature, and for the at least one feature created, the solid model 3D application assigns to it a unique feature identification number, commonly known as a FID, also known as Creator ID or CID, as the solid model 3D application correlates the FID to all the entities that feature created. Furthermore, when the user adds/edits features and if the previous features' entities are used as inputs, the application commonly creates a proxy for each entity to bind to, commonly known as an entity proxy.

Figure 4:
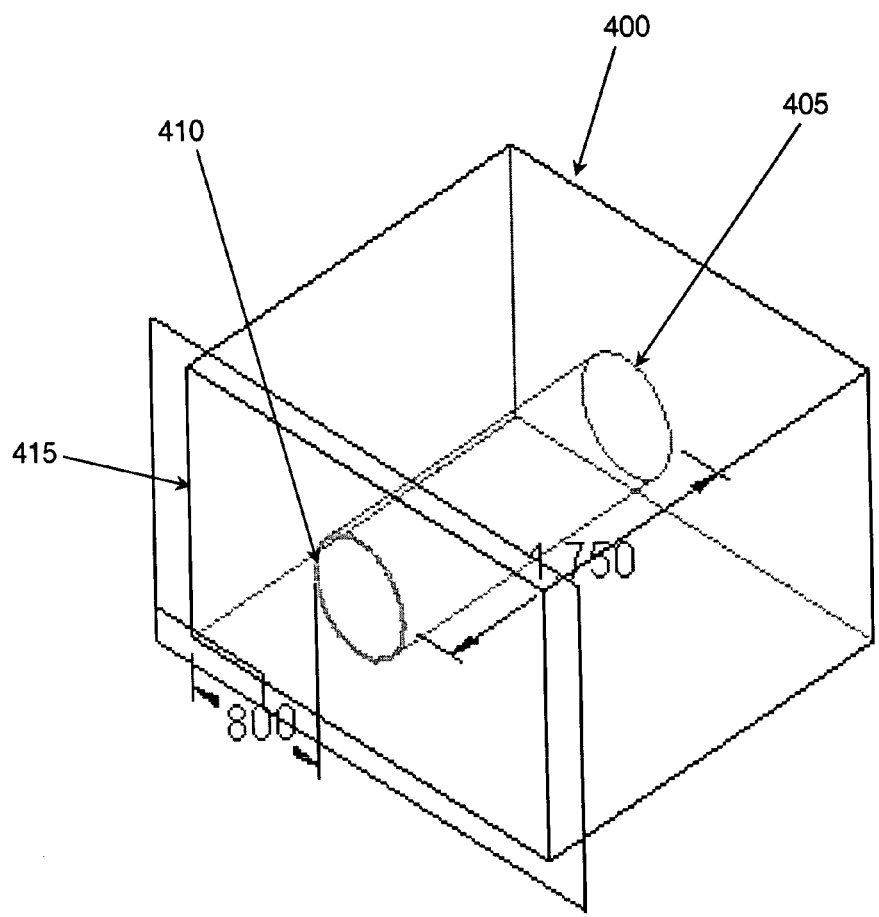
FIG. 4 is an illustration of a solid model with a plurality of dimension features and a hole feature.

For example referring to FIG. 4, the user creates a cube feature 400, with a cube entity comprising the entities of six faces, twelve edges, and eight vertices. The user then places a hole feature 405 through the cube 400 with a hole edge 410 that is 0.800 inches from a straight reference edge 415 and a hole length extending through the cube 400 terminating 1.750 inches at an opposing cube face, wherein a hole entity comprises the entities of one face and two edges. In practice, the user identifies which entity on the cube 400 to bind the hole 405, most commonly and in this example a cube's straight reference edge 415, but the user could have selected a cube face center or a cube vertex.

When the user placed the hole 405 through the cube 400, the application created an edge proxy (not depicted) to identify the straight reference edge 415 bound to the hole 405, and used the edge proxy to position the hole 405 in the cube 400, wherein the edge proxy is the parent to the hole 405. The aforementioned events occur so that when the application re-computes, the hole 405 properly binds to the cube's straight reference edge 415 and is placed according to the design intent.

Figure 5:
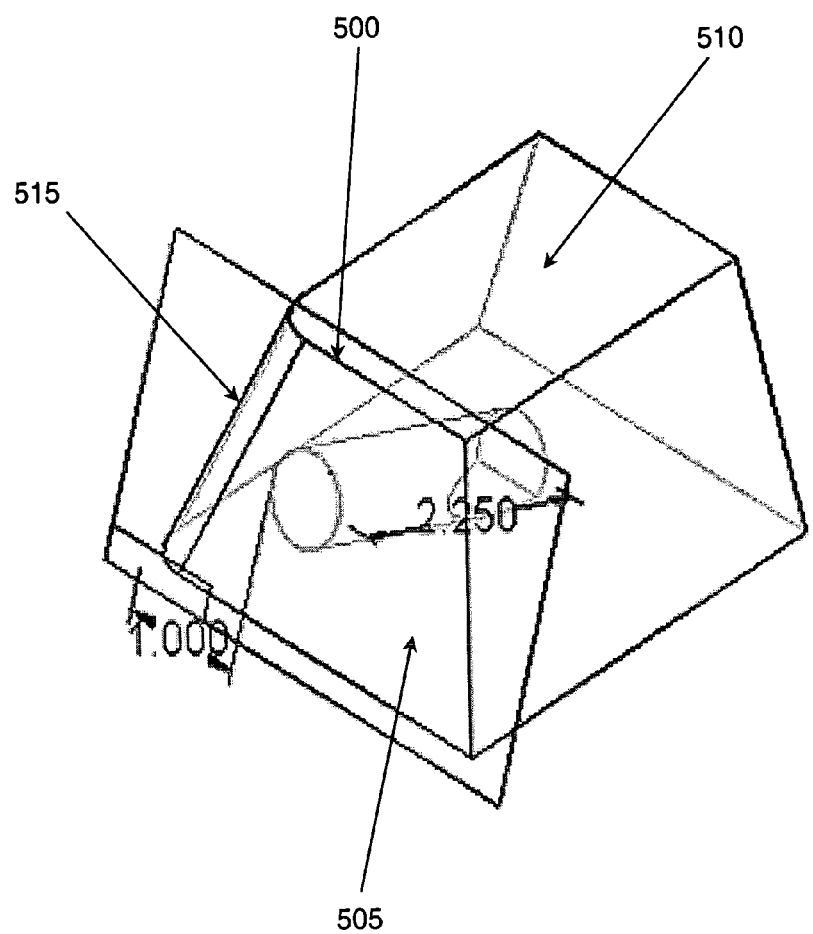
FIG. 5 is an illustration of a solid model with a plurality of dimension features, a draft feature, a round feature, and a hole feature.
Figure 7A:
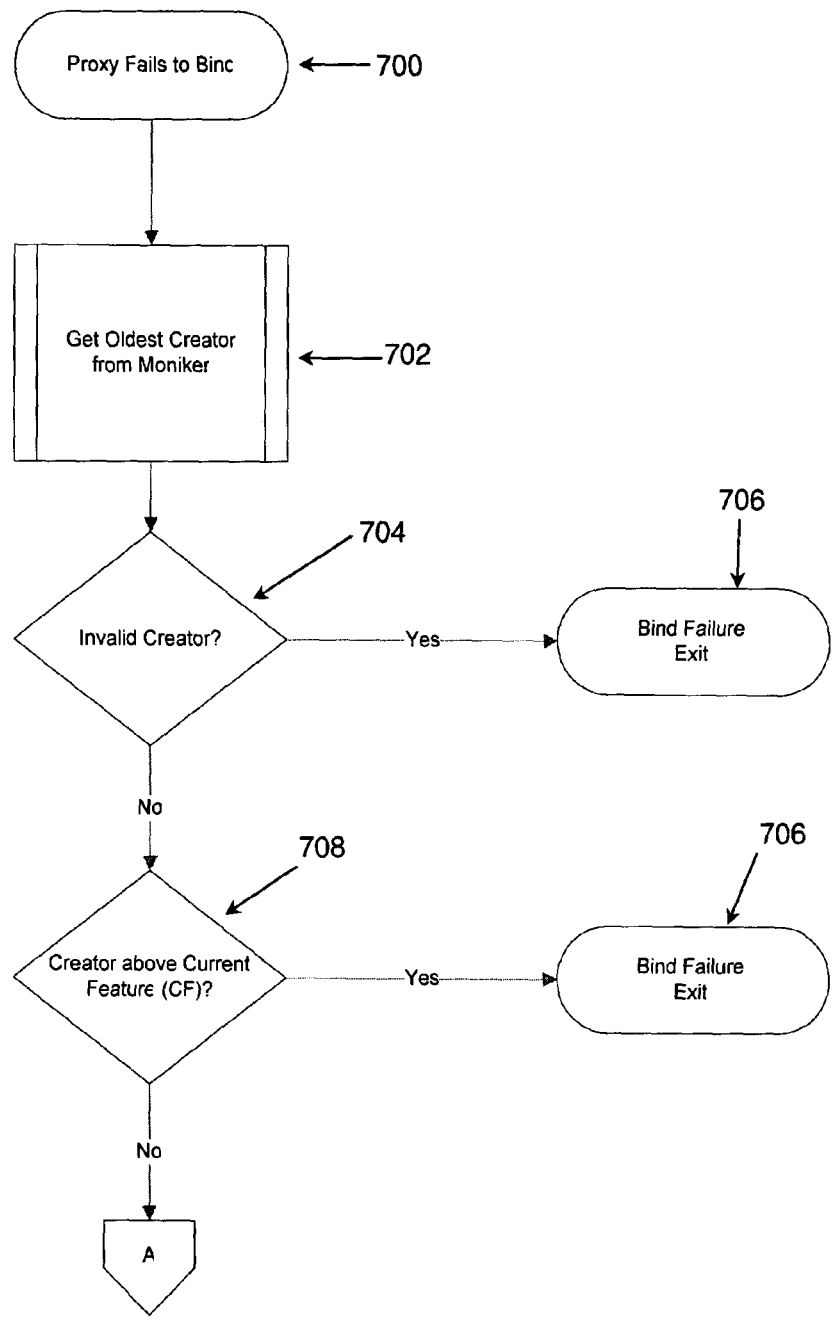
FIGS. 7A-7G illustrate the logic involved with a RollToBind operation in accordance with the present invention.
Figure 7B:
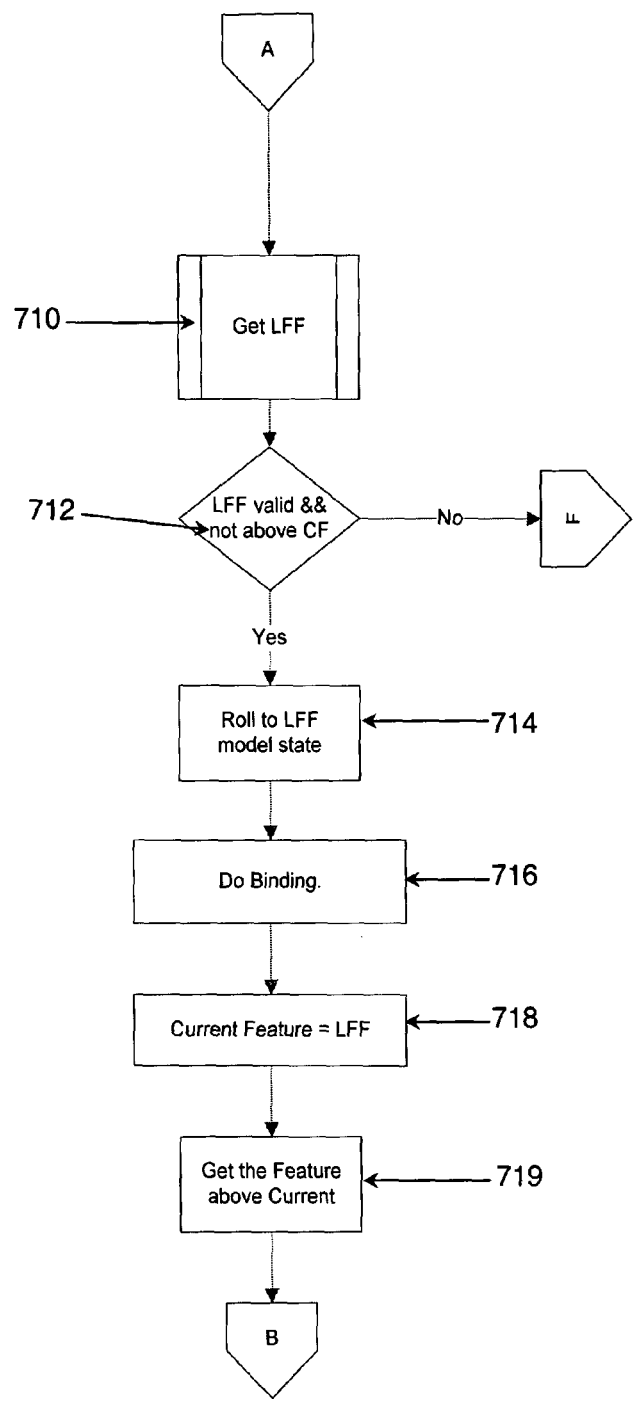
Figure 7C:
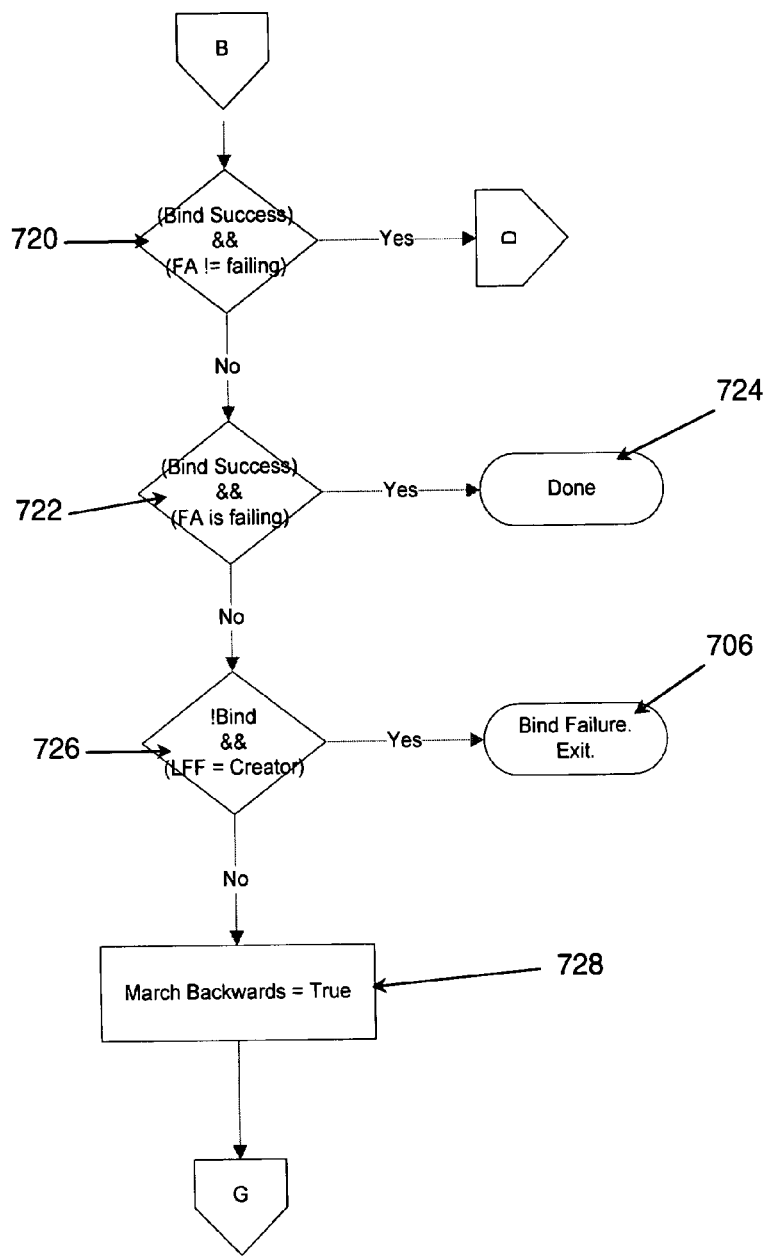
Figure 7D:
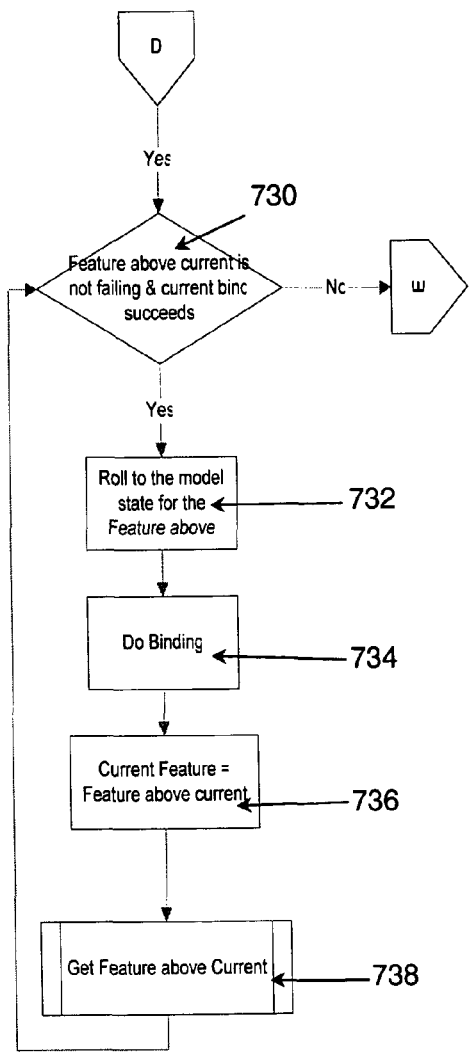
Figure 7E:
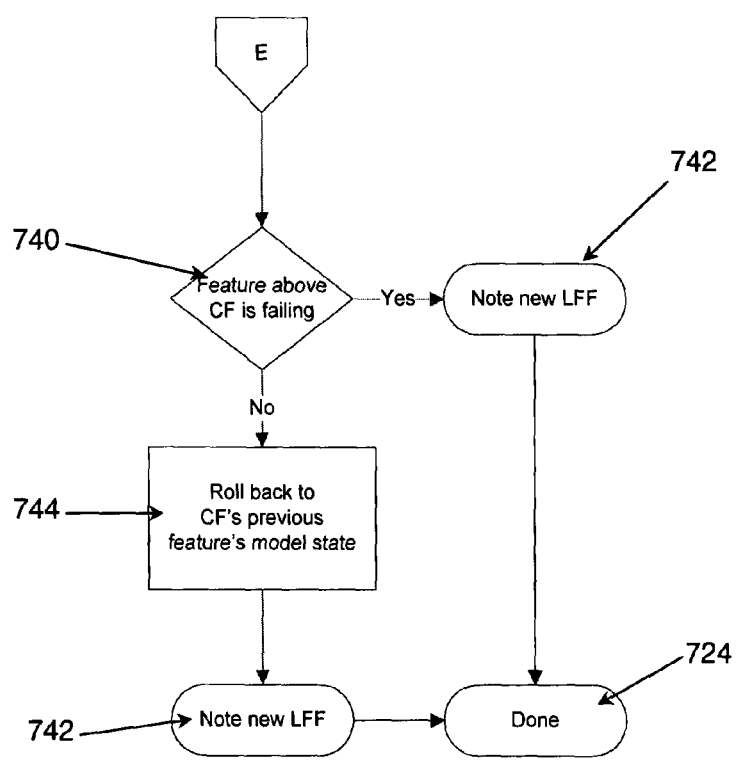
Figure 7F:
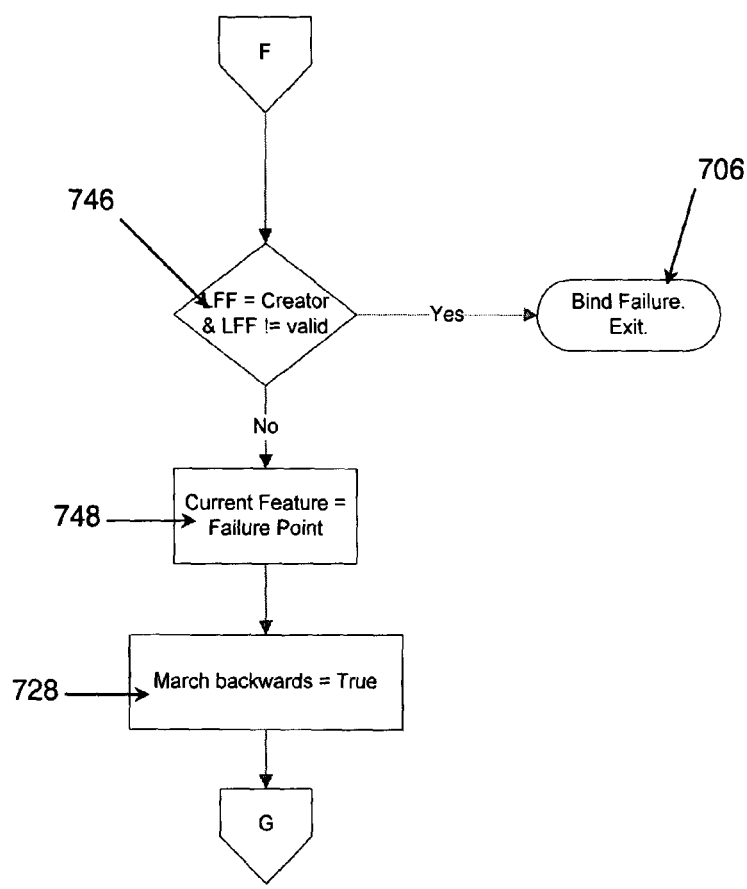
Figure 7G:
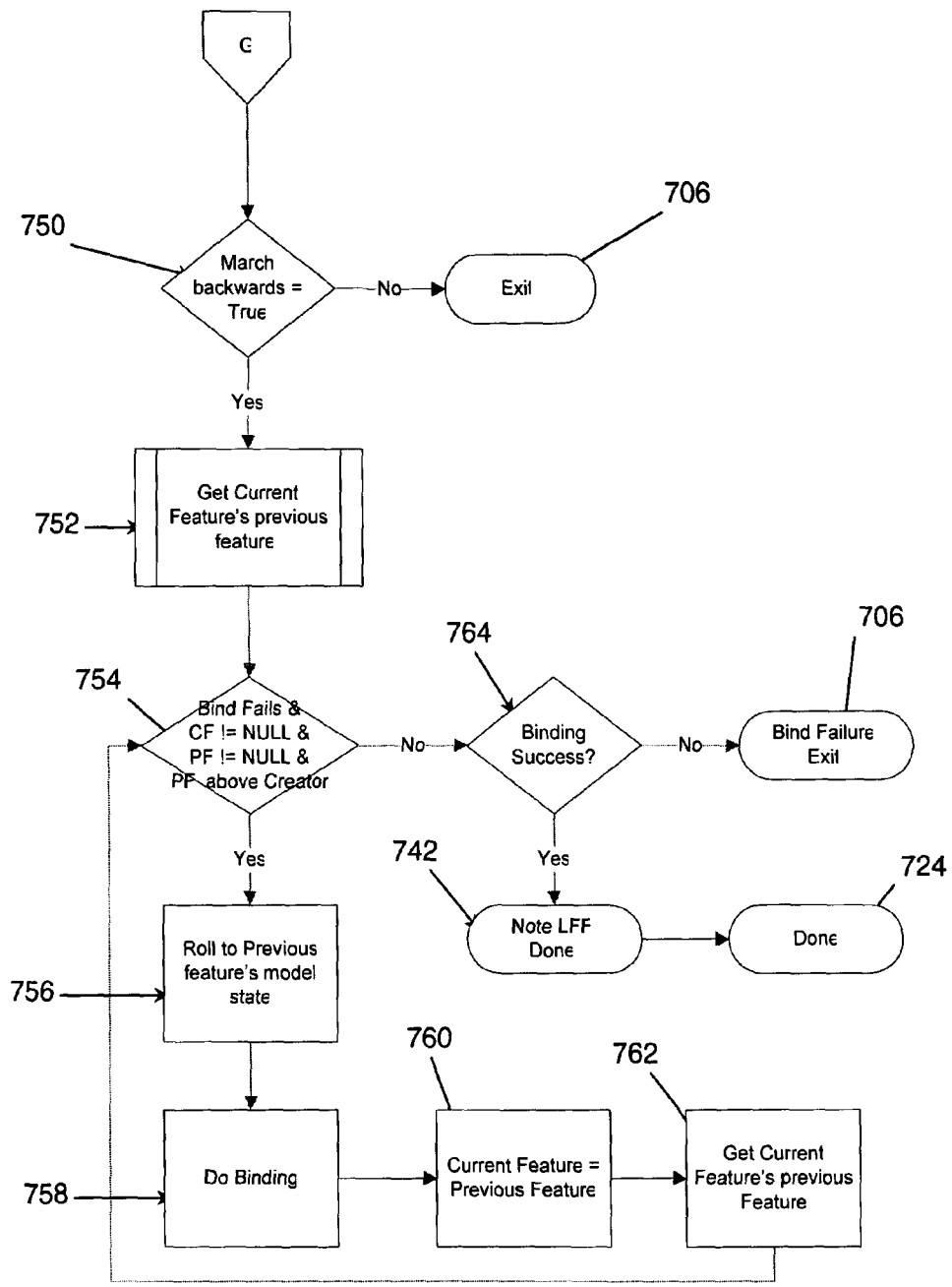

And referring further to FIG. 5, after having created the cube 400, and then the hole 405, the user rolls the solid model back the feature tree to the cube 400, to insert a draft feature 500, where it should be noted that at this stage of the roll back, the hole 405 is not visible in the cube 400, but will become part of the model on re-compute, see below. The draft 500 occurs, for example, when the application slopes a cube face 505 toward a cube center 510 for 45 degrees. The creation of the draft 500 essentially places a new two-dimensional face on the cube, and by doing so, the draft 500 has a draft entity composed of four faces, four edges, and two vertices. Moreover the application creates a plurality of proxies necessary for the application to bind the draft 500 to the cube 400, and in an effort to maintain the design intent, the user adds yet another feature to the object after the draft 500 and before the hole 405, according to the following model example of sequential steps, cube→draft round→hole.

To create the round feature 515, the user chooses a draft edge (not depicted), wherein the round 515 composes a round entity of one face and two edges. In creating the round 515, the application creates a draft edge proxy (not depicted) for which to bind the round 515. The user then rolls forward to the hole 405, and the application re-computes the position of the hole 405. At this point there is a bind failure because the hole 405 needed its parent, i.e. the edge proxy, to bind to for proper placement within the object. However the edge proxy is no longer present because the straight reference edge 415 has been alter or destroyed with the addition of the round 515.

Referring now to FIG. 6, an illustration of the flow diagram for the RollToBind operation. To begin the parent body is created with patent entities (Step 600). If there is a subsequent modification to the parent body that requires bind to the parent entities (Step 605yes), then check if there is a successful bind (Step 610yes). If the bind is successful (Step 620), then check to see if there is not a subsequent modification to the parent body that requires bind to the parent entities (Step 605no) and then exit (Step 625).

Otherwise if the bind is not successful (Step 610no), calls a RollToBind operation (illustrated in FIGS. 7A-7G) that rolls back the features to previous model states (Step 615), and up the feature tree, one feature at a time until the hole 405 can find the edge proxy to bind to successfully (Step 610yes). Once the hole 405 finds the edge proxy to bind to, the bind occurs so the hole 405 is successfully placed (Step 620), and the application rolls the feature tree forward until all features are successfully displayed and without bind failures (Step 625).

Discussion of the RollToBind Operation

Referring now to FIG. 7A through 7G where the process of the RollToBind operation is described in greater detail. When the bind to parent fails (Step 700), get an oldest CID from a moniker (Step 702) and determine if the CID is valid. If the CID is NOT valid (Step 704yes), then there is a bind failure and the operation exits (Step 706). Otherwise if the CID is valid (Step 704no), then determine if the CID has a time stamp that is later in time than a current feature (CF), wherein the CF is the feature where the proxy failed to bind, and if true (Step 708yes), then there is a bind failure and the operation exits (Step 706).

Continuing on, if the time stamp for the CID is earlier in time than the time stamp for the CF (Step 708no), the Last Found Feature (LFF) is retrieved (Step 710) from the proxy with the last stored LFF. If the LFF is valid and has an earlier time stamp than CF (Step 712yes), then roll forward to the model state for the LFF (Step 714); do the binding (Step 716); set the CF to LFF (Step 718); and get the Feature with the time stamp later than CF (Step 719).

Continuing on if the statement the bind was successful and the Feature with the time stamp later (FA) than CF is not a failing feature is a false statement (Step 720no), then determine if the bind was successful and the FA is the failing feature (Step 722yes), then the operation exits with a successful bind (Step 724). However, in the event the bind was successful and the Feature with the time stamp later than CF is the failing feature is a false statement (Step 722no), then if the bind failed and the LFF is equal to the CID (Step 726yes), then exit with a bind failure (Step 706). However, if the bind did not fail and/or the statement LFF is not equal to the CID (Step 726no), then set a March Backwards Flag equal to true (Step 728), to be discussed in more detail below.

Continuing on, if the bind was successful and the Feature with the time stamp later than CF is not the failing feature (Step 720yes), then while the feature with the later time stamp than CF is not the failing feature and the CF binds successfully (Step 730yes), roll the feature forward to the model state of the Feature with the time stamp later than CF (Step 732); bind (Step 734); set CF to Feature with the time stamp later than CF (Step 736); and get the feature above CF (Step 738).

However, if the feature with the later time stamp than CF is the failing feature and/or the CF does not bind successfully (Step 730no), then if the Feature with the time stamp later than CF is failing (Step 740yes) set the LFF flag to the last found Feature (Step 742) and exit with a successful bind (Step 724). Alternatively, if the Feature with the time stamp later than CF is not failing (Step 740no), then roll back to the model state of the Feature that is one step earlier in time than the CF (Step 744), set the LFF flag to the last found Feature (Step 742), and exit with a successful bind (Step 724).

Continuing on, if the condition of LFF is not valid and/or the LFF with the time stamp is later than CF (Step 712no), then if the LFF is equal to CID and LFF is invalid (Step 746yes), there is a bind failure and the operation exits (Step 706). Otherwise, if the LFF is equal to CID and LFF is not valid is a false statement (Step 746no), set CF equal to a failure point (FP) (Step 748) and set the March Backwards Flag equal to true (Step 728).

Continuing on, if the March Backwards Flag was set to false (Step 750no), then there is a bind failure and the operation exits (Step 706). However, if the March Backwards Flag is set to true (Step 750yes), get the PF equal to the Feature for the feature with the time stamp one unit earlier in time (Step 752). Then while the bind failed, CF is not null, PF is not null, and PF does not have the time stamp later than CID (Step 754yes), then roll forward to the PF (Step 756); bind (Step 758); set CF equal to PF (Step 760); and get PF equal to the Feature for the feature with the time stamp one unit earlier in time (Step 762). In the event the while loop does fail (Step 754no), and then if there is a successful binding (Step 764yes), the LFF flag is set to the last found Feature (Step 742) and exits with a successful bind (Step 724). Otherwise if the bind was not successful (Step 764no), there is a bind failure and the operation exits 706.

The invention may be implemented in digital electronic circuitry, or in computer hardware, firmware, software, or in combinations thereof. An apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Generally, a processor will receive instructions and data from a read-only memory and/or a random access memory. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits).

The preferred embodiment of the present invention has been described as a 3D solid model, but the present invention can apply to all other model types like sheet metal or wires, for example. It will be understood that various modifications may be made without departing from the spirit and scope of the invention. Therefore, other implementations are within the scope of the following claims.

What is claimed is:

1. A method of binding a plurality of features in a geometric model, comprising the steps of:
    modifying a geometric model by inserting a modifying object feature into said geometric model between a prior object feature of said geometric model and a following object feature of said geometric model, wherein said modifying object feature has an entity that modifies the prior object feature and wherein said object features contain a plurality of feature entities;
    re-computing said geometric model in a programmable processing unit, comprising the steps of:
        verifying a proxy bind operation for said object features; and
        if said verifying step is not successful:
            rolling back said geometric model to a prior feature state;
            binding the modified object feature to the feature entity for the prior object feature; and
            repeating said re-computing step; and
    rolling the modified geometric model forward to display said object features.

2. The method of claim 1, wherein said feature entities are comprised of a face, an edge or a vertex.

3. The method of claim 1, wherein said geometric model can be one of a solid model, a surface model, or a wire model.

4. A method of successfully displaying a three-dimensional geometric model with at least three object features comprising the steps of:
    inserting a modifying object feature between a prior object feature and a following object feature of a geometric model in a programmable processing unit wherein said prior object feature has a plurality of parent entities and said following object feature binds to said plurality of parent entities, such that the insertion of said modifying object feature alters an entity of said geometric model;
    rolling said geometric model forward to display all said object features wherein, if said following object feature fails to bind to at least one of said parent entities, said geometric model is rolled back to said prior object feature until said following object feature successfully binds to said parent entity;
    and following the successful bind of said following object feature to said parent entity, rolling forward said geometric model to display all object features.

5. The method of claim 4, wherein said parent entities are comprised of a face, an edge or a vertex.

6. The method of claim 4, wherein said rolling forward of said model displays all object features without a bind failure.

7. The method of claim 4, wherein said geometric model can be one of a solid model, a surface model, or a wire model.

8. A method of designing a geometric model, comprising the step of:
    binding a child entity having a parent entity to an ancestor entity, in a programmable processing unit, wherein said parent entity has been previously destroyed and wherein said parent entity and said ancestor entity are each one of spline or analytic.

9. The method of claim 8, wherein said geometric model can be one of a solid model, a surface model, or a wire model.

10. A method of re-computing a geometric model, comprising the steps of:
    re-computing said geometric model in a programmable processing unit;
    modifying a plurality of object features by binding a plurality of child features to a plurality of parent entities; and
    rolling said geometric model forward to display said modified object features, wherein the step of modifying a plurality of object features by binding a plurality of child features to a plurality of parent entities further comprises the steps of
    verifying a proxy bind operation in a programmable processing unit for said object features; and if said verifying step is not successful:
    rolling back said geometric model to a prior feature state;
    binding the modified object feature to the feature proxy for the prior object feature; and repeating said rolling forward step.

11. A non-transitory computer readable medium for storing executable instructions to perform a method for geometric model design, comprising:
    instructions for successfully displaying a three-dimensional geometric model with at least three object features wherein one object feature is a prior object feature, one object feature is a modifying object feature, and one object feature is a following object feature
    instructions for inserting said modifying object feature between said prior object feature and said following object feature of said geometric model wherein said prior object feature has a plurality of parent entities and said following object feature binds to said plurality of parent entities, such that the insertion of said modifying object feature alters an entity of said geometric model;
    instructions for rolling said geometric model forward to display all object features wherein if said following object feature fails to bind to at least one of said parent entities, said geometric-model is rolled back to said prior object feature until said following object feature successfully binds to said parent entity; and instructions for rolling forward said geometric model to display all object features without a bind failure following the successful bind of said following object feature to said parent entity.

12. The computer readable medium of claim 11, wherein said geometric model can be one of a solid model, a surface model, or a wire model.

13. The computer readable medium of claim 11, wherein said parent entities are comprised of a face, an edge, or a vertex.

14. A non-transitory computer readable medium for storing executable instructions to perform a method of binding a plurality of features in a geometric model, comprising:

instructions for modifying a geometric model by inserting a modifying object feature into said geometric model between a prior object feature of said geometric model and following object feature of said geometric model, wherein said modifying object feature has an entity that modifies the prior object feature and wherein said object features contain a plurality of feature entities;

instructions for re-computing said geometric model; and instructions for rolling the modified geometric model forward to display said object features, wherein said instructions for re-computing said geometric model comprise instructions for: verifying a proxy bind operation for said object features; and if said verifying instruction is not successful:

rolling back said geometric model to a prior feature state; binding the modified object feature to the feature proxy for the prior object feature; and repeating said re-computing instruction.

15. The computer readable medium of claim 14, wherein said geometric model can be one of a solid model, a surface model, or a wire model.

16. The computer readable medium of claim 14, wherein said feature entities are comprised of a face, an edge or a vertex.

17. A non-transitory computer readable medium for storing executable instructions to perform a method of binding a plurality of features in a geometric model, comprising the step of:

binding a child entity having a parent entity to an ancestor entity, wherein said parent entity has been destroyed, and wherein said parent entity and said ancestor entity are each one of spline or analytic.

18. The computer readable medium of claim 17, wherein said geometric model can be one of a solid model, a surface model, or a wire model.

* * * * *